(12) United States Patent
Tsai

(10) Patent No.: US 10,847,480 B2
(45) Date of Patent: Nov. 24, 2020

(54) SEMICONDUCTOR PACKAGE WITH IN-PACKAGE COMPARTMENTAL SHIELDING AND FABRICATION METHOD THEREOF

(71) Applicant: Chung-Che Tsai, Taipei (TW)

(72) Inventor: Chung-Che Tsai, Taipei (TW)

(73) Assignees: Shiann-Tsong Tsai, Hsinchu (TW); Hsien-Chou Tsai, Taipei (TW); Hsien-Wei Tsai, Taipei (TW); Yen-Mei Tsai Huang, Taipei (TW)

( * ) Notice: Subject to any disclaimer, the term of this patent is extended or adjusted under 35 U.S.C. 154(b) by 0 days.

(21) Appl. No.: 16/237,725

(22) Filed: Jan. 1, 2019

(65) Prior Publication Data

US 2020/0168566 A1    May 28, 2020

(30) Foreign Application Priority Data

Nov. 28, 2018    (TW) .................................. 107142358

(51) Int. Cl.
*H01L 23/552*    (2006.01)
*H01L 23/66*    (2006.01)
(Continued)

(52) U.S. Cl.
CPC .......... *H01L 23/66* (2013.01); *H01L 21/4867* (2013.01); *H01L 21/565* (2013.01); *H01L 23/3128* (2013.01); *H01L 23/552* (2013.01); *H01L 24/09* (2013.01); *H01L 24/49* (2013.01); *H01L 25/18* (2013.01); *H01L 2223/6666* (2013.01); *H01L 2924/01029* (2013.01); *H01L 2924/01079* (2013.01); *H01L 2924/15311* (2013.01)

(58) Field of Classification Search
CPC ..... H01L 23/66; H01L 23/552; H01L 21/565; H01L 21/4867
USPC ........................................ 257/728, 659, 660
See application file for complete search history.

(56) References Cited

U.S. PATENT DOCUMENTS

| 5,166,772 A | 11/1992 | Soldner |
| 5,256,590 A | 10/1993 | Inoue |

(Continued)

FOREIGN PATENT DOCUMENTS

| CN | 107808854 A | 3/2018 |
| CN | 109390239 A | 2/2019 |

(Continued)

*Primary Examiner* — Nitin Parekh
(74) *Attorney, Agent, or Firm* — Winston Hsu

(57) ABSTRACT

A semiconductor package includes a substrate. At least a high-frequency chip and a circuit component susceptible to high-frequency interference are disposed on a top surface of the substrate. A first ground ring is disposed on the substrate surrounding the high-frequency chip. A first metal-post reinforced glue wall is disposed on the first ground ring surrounding the high-frequency chip. A second ground ring is disposed on the top of the substrate surrounding the circuit component. A second metal-post reinforced glue wall is disposed on the second ground ring surrounding the circuit component. A molding compound covers at least the high-frequency chip and the circuit component. A conductive layer is disposed on the molding compound and is coupled to the first metal-post reinforced glue wall and/or the second metal-post reinforced glue wall.

17 Claims, 11 Drawing Sheets

(51) Int. Cl.
*H01L 21/48* (2006.01)
*H01L 21/56* (2006.01)
*H01L 23/31* (2006.01)
*H01L 23/00* (2006.01)
*H01L 25/18* (2006.01)

(56) References Cited

U.S. PATENT DOCUMENTS

| | | | |
|---|---|---|---|
| 5,354,951 A | 10/1994 | Lange, Sr. | |
| 6,086,649 A * | 7/2000 | Tuvin | A47L 9/1427 55/367 |
| 6,194,655 B1 | 2/2001 | Lange, Sr. | |
| 6,686,649 B1 * | 2/2004 | Mathews | H01L 23/552 257/659 |
| 7,629,674 B1 * | 12/2009 | Foster | H01L 21/56 257/659 |
| 8,199,518 B1 * | 6/2012 | Chun | H01L 23/3128 361/767 |
| 9,508,683 B1 | 11/2016 | Choi | |
| 9,721,903 B2 * | 8/2017 | Lee | H01L 23/552 |
| 10,091,918 B2 | 10/2018 | Zhang | |
| 10,535,612 B2 * | 1/2020 | Chen | H01L 23/552 |
| 2002/0167060 A1 | 11/2002 | Buijsman | |
| 2003/0102552 A1 | 6/2003 | Martin | |
| 2008/0061406 A1 | 3/2008 | Joh | |
| 2008/0284001 A1 | 11/2008 | Mori | |
| 2009/0302436 A1 * | 12/2009 | Kim | H01L 23/3121 257/659 |
| 2011/0115060 A1 | 5/2011 | Chiu | |
| 2011/0260342 A1 | 10/2011 | Tsukurimichi | |
| 2012/0025356 A1 | 2/2012 | Liao | |
| 2012/0280366 A1 | 11/2012 | Kamgaing | |
| 2013/0020685 A1 * | 1/2013 | Kwak | H01L 23/552 257/659 |
| 2013/0056686 A1 | 3/2013 | Namiki | |
| 2013/0214396 A1 | 8/2013 | Kim | |
| 2014/0048914 A1 * | 2/2014 | Lin | H01L 23/552 257/659 |
| 2015/0118792 A1 | 4/2015 | Kawamori | |
| 2015/0129874 A1 | 5/2015 | Choi | |
| 2015/0171022 A1 * | 6/2015 | Sirinorakul | H01L 23/552 257/659 |
| 2015/0315427 A1 | 11/2015 | Yoshida | |
| 2016/0020187 A1 | 1/2016 | Okada | |
| 2016/0073496 A1 | 3/2016 | Vincent | |
| 2016/0189985 A1 | 6/2016 | Kasai | |
| 2016/0189986 A1 | 6/2016 | Kasai | |
| 2016/0204073 A1 * | 7/2016 | Beak | H01L 23/295 455/418 |
| 2017/0104149 A1 | 4/2017 | Ugge | |
| 2017/0117229 A1 | 4/2017 | Kumbhat | |
| 2017/0179039 A1 | 6/2017 | Lee | |
| 2017/0181287 A1 | 6/2017 | Jhang | |
| 2017/0278804 A1 | 9/2017 | Kawabata | |
| 2017/0287851 A1 | 10/2017 | Prakash | |
| 2017/0287870 A1 | 10/2017 | Fang | |
| 2018/0033764 A1 | 2/2018 | Huang | |
| 2018/0092257 A1 | 3/2018 | Otsubo | |
| 2018/0324940 A1 | 11/2018 | Choi | |
| 2019/0103389 A1 | 4/2019 | Chang | |
| 2019/0189565 A1 * | 6/2019 | Chen | H01L 23/3128 |
| 2020/0091128 A1 * | 3/2020 | Elsherbini | H01L 23/66 |

FOREIGN PATENT DOCUMENTS

| | | |
|---|---|---|
| EP | 1 594 163 A1 | 11/2005 |
| JP | H04-199667 A | 7/1992 |
| JP | 2009-70882 A | 4/2009 |
| JP | 2010-56180 A | 3/2010 |
| JP | 2010-225620 A | 10/2010 |
| JP | 2015-93475 A | 5/2015 |
| JP | 2016-103616 A | 6/2016 |
| JP | 2017-117986 A | 6/2017 |
| JP | 2017-199896 A | 11/2017 |
| JP | 2018-41899 A | 3/2018 |
| JP | 2018-142611 A | 9/2018 |
| JP | WO2018/164158 A1 | 9/2018 |
| KR | 10-2013-0098899 A | 9/2013 |
| KR | 10-2015-0094669 A | 8/2015 |
| KR | 10-2017-0016026 A | 2/2017 |
| KR | 10-2017-0118884 A | 10/2017 |
| TW | 200843930 | 11/2008 |
| TW | 201216417 A1 | 4/2012 |
| TW | I411086 B | 10/2013 |
| TW | 201546985 A | 12/2015 |
| TW | 201642360 A | 12/2016 |
| TW | 201705830 A | 2/2017 |
| TW | M547185 U | 8/2017 |
| TW | 201801282 A | 1/2018 |
| TW | 201812937 A | 4/2018 |
| TW | 201818513 A | 5/2018 |
| WO | 20161181954 A1 | 11/2016 |
| WO | 2016/195026 A1 | 12/2016 |
| WO | 2018/164158 A1 | 9/2018 |

\* cited by examiner

SEMICONDUCTOR PACKAGE WITH IN-PACKAGE COMPARTMENTAL SHIELDING AND FABRICATION METHOD THEREOF

BACKGROUND OF THE INVENTION

1. Field of the Invention

The invention relates to the technical field of semiconductor technology. In particular, the invention relates to a semiconductor package with an in-package compartmental shielding and a method for fabricating the same.

2. Description of the Prior Art

Portable electronic devices, such as mobile phones, typically utilize multi-component semiconductor modules to provide a high degree of circuit integration in a single molded package. The multi-component semiconductor module may include, for example, semiconductor chips and a plurality of electronic components mounted on a circuit board. The circuit board on which semiconductor chips and electronic components are mounted is packaged in a molding process to form an over-molded semiconductor package structure.

In order to ensure that devices such as mobile phones operate properly in different environments to achieve the required level of performance, over-molded semiconductor packages are typically shielded from electromagnetic interference (EMI). The above electromagnetic interference is an adverse effect on the performance of the component produced in the electrical system due to electromagnetic, e.g., radio frequency (RF) radiation and electromagnetic conduction.

As chip modules, such as system-in-package (SiP), become smaller and smaller, the distance between components is also reduced, making the circuits within the module more sensitive to EMI, so it is necessary to dispose EMI shielding between components within the module. However, the prior art method for forming the EMI shielding in the module is complicated and costly. Therefore, the current challenge in this technology field is to provide effective EMI shielding for over-molded semiconductor packages without increasing package size and process complexity, and without significantly increasing packaging costs.

SUMMARY OF THE INVENTION

It is one object of the present invention to provide a semiconductor package having an in-package compartmental shielding and a method of fabricating the same to address the deficiencies and shortcomings of the prior art described above.

An embodiment of the invention discloses a semiconductor package having an in-package compartmental shielding, comprising: a substrate, at least one high-frequency chip and a circuit component susceptible to high-frequency signal interference on a top surface of the substrate; a first ground ring, on the top surface of the substrate, surrounding the high-frequency chip; a first metal-post reinforced glue wall disposed on the first ground ring, surrounding the high-frequency chip; a second ground ring surrounding the circuit component on the top surface of the substrate; a second metal-post reinforced glue wall disposed on the second ground ring surrounding the circuit component; a molding compound covering at least the high-frequency chip and the circuit component; and a conductive layer disposed on the molding compound and in contact with the first metal-post reinforced glue wall and/or the second metal-post reinforced glue wall.

According to an embodiment of the invention, the first metal-post reinforced glue wall comprises a plurality of first metal posts, wherein one end of each of the plurality of first metal posts is fixed on the first ground ring, and the other end is suspended, and the plurality of first metal posts surrounds the high-frequency chip.

According to an embodiment of the invention, the second metal-post reinforced glue wall comprises a plurality of second metal posts, wherein one end of each of the plurality of second metal posts is fixed on the second ground ring, and the other end is suspended, and the plurality of second metal posts surrounds the circuit component.

According to an embodiment of the invention, the first metal-post reinforced glue wall or the second metal-post reinforced glue wall further comprises a glue attached to a surface of the first or second metal posts. According to an embodiment of the invention, a composition of the molding compound is different from a composition of the glue.

In another aspect, embodiments of the present invention disclose a method for fabricating a semiconductor package having an in-package compartmental shielding. Firstly, a substrate is provided. At least one high-frequency chip and a circuit component susceptible to high-frequency interference are disposed on a top surface of the substrate. The top surface of the substrate is further provided with a first ground ring, surrounding the high-frequency chip, and a second ground ring, surrounding the circuit component. A first metal-post reinforced glue wall is formed on the first ground ring to surround the high-frequency chip. A second metal-post reinforced glue wall is formed on the second ground ring to surround the circuit component. A molding compound is formed to cover at least the high-frequency chip and the circuit component. A conductive layer is then formed on the molding compound to contact the first metal-post reinforced glue wall and/or the second metal-post reinforced glue wall.

According to an embodiment of the invention, the method further includes: forming a plurality of first metal posts, wherein one end of each of the plurality of first metal posts is fixed on the first ground ring, and the other end is suspended, and the plurality of first metal posts surround the high-frequency chip.

According to an embodiment of the invention, the method further includes: forming a plurality of second metal posts, wherein one end of each of the plurality of second metal posts is fixed on the second ground loop, and the other end is suspended, and the plurality of second metal posts surround the circuit component.

According to an embodiment of the invention, the method further comprises: forming a glue attached to a surface of the first or second metal posts.

Another aspect of the invention provides a semiconductor package including a substrate having at least one semiconductor chip disposed on a top surface of the substrate; a ground ring surrounding the semiconductor chip on the top surface of the substrate; a metal-post reinforced glue wall disposed on the ground ring to surround the semiconductor chip; and a molding compound disposed only inside the metal-post reinforced glue wall and covering the semiconductor chip.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The technical solutions in the embodiments of the present invention are clearly and completely described in the following description with reference to the accompanying drawings. It is obvious that the described embodiments are only a part of the embodiments of the present invention, and not all embodiments. All other embodiments obtained by those skilled in the art based on the embodiments of the present invention without creative efforts are within the scope of the present invention.

The present disclosure discloses a semiconductor package having in-package shielding, such as a System-in-Package (SiP), and a method of fabricating the same. SiP refers to the integration of multiple functional chips, including functional chips such as processors and memories, and other components, such as passive components, into a single package to achieve a complete function. As mentioned earlier, as electronic systems become smaller and the density of electronic components in SiP packages becomes higher and higher, electromagnetic interference (EMI) within the system is problematic, especially for high-frequency chip package structures, for example, high-frequency chips such as RF chips, GPS chips, and Bluetooth chips integrated into the SiP package to form an integrated structure, which generates electromagnetic interference between electronic components in the package. The present invention thus proposes a method for fabricating a semiconductor package that is simplified in process, low in cost, and effective, and can specifically solve the problems faced by the prior art.

Figure 1:
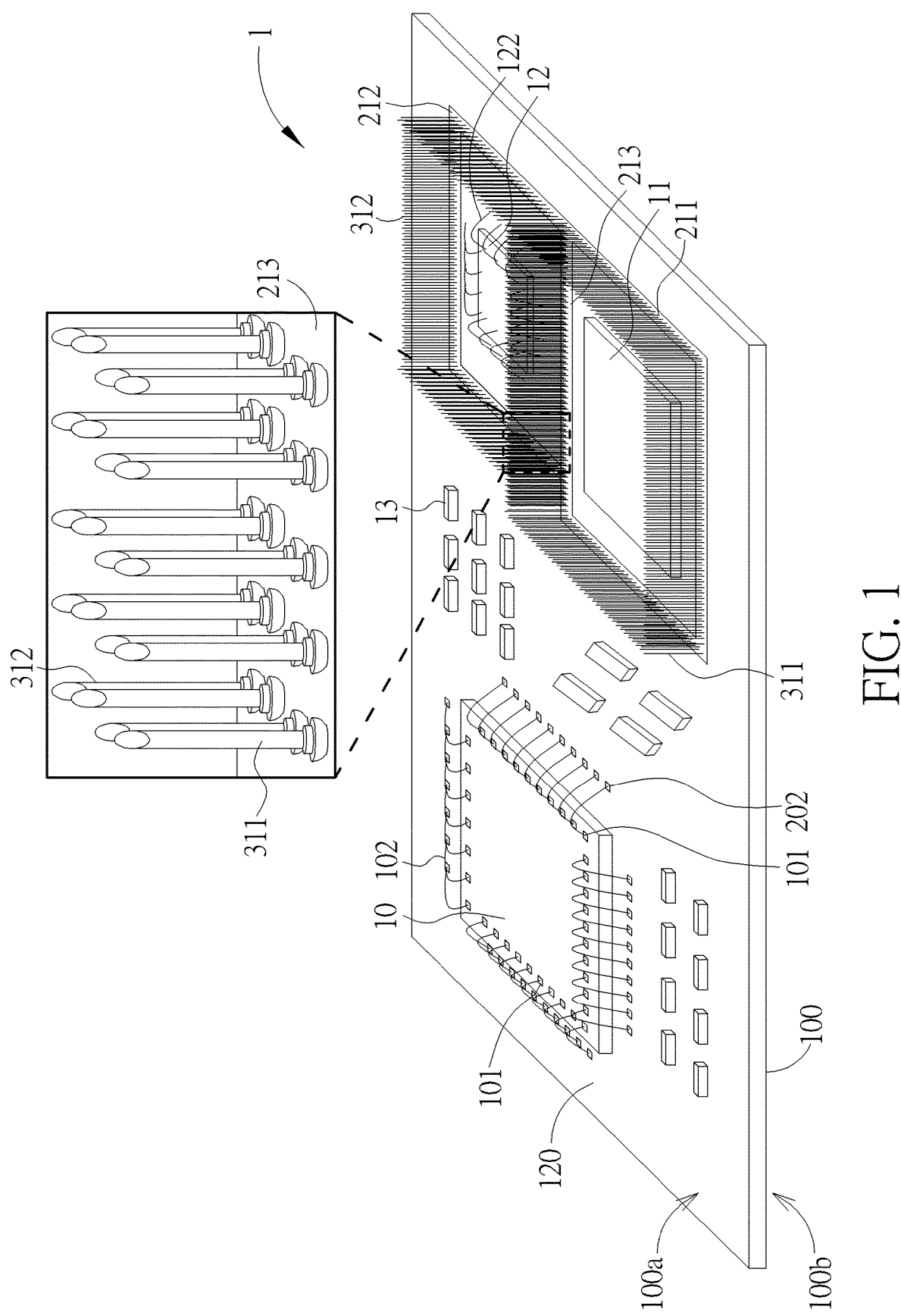
FIG. 1 to FIG. 5 are schematic diagrams showing a method of fabricating a semiconductor package having an in-package compartmental shielding according to an embodiment of the invention.

FIG. 1 to FIG. 5 are schematic diagrams showing a method of fabricating a semiconductor package 1 having an in-package compartmental shielding according to an embodiment of the invention. As shown in FIG. 1, a substrate 100, such as a circuit board or a package substrate, is first provided. According to an embodiment of the present invention, for example, the substrate 100 may be a two-layer substrate, for example, a substrate having a core layer and two metal layers, but is not limited thereto. The substrate 100 may comprise ceramic material, laminated insulating material, or other suitable type of material. Although not shown in FIG. 1, the substrate 100 may also include patterned metal layers or traces on its top surface 100a and bottom surface 100b and vias. In addition, a solder resist layer 120 (also referred to as green paint) may be additionally disposed on the top surface 100a and the bottom surface 100b of the substrate 100.

According to an embodiment of the present invention, a plurality of semiconductor chips 10~12 adjacent to each other may be disposed on the top surface 100a of the substrate 100. For example, the semiconductor chip 10 may be a power management IC (PMIC), the semiconductor chip 11 may be a radio frequency chip (RFIC), and the semiconductor chip 12 may be a power amplifier IC (PAIC), but is not limited thereto.

Those skilled in the art will appreciate that the types of semiconductor chips 10-12 described above are merely illustrative. In order to achieve different circuit functions, different semiconductor chips or components may be disposed on the substrate 100, such as a processor, a flash memory, a dynamic random access memory (DRAM), a controller or the like. In accordance with an embodiment of the present invention, at least one high-frequency chip or die, such as semiconductor chip 11, and at least one circuit component or die susceptible to high-frequency signal interference, such as semiconductor chip 12, are disposed on top surface 100a of substrate 100.

According to an embodiment of the invention, for example, the semiconductor chips 10 and 12 may be disposed on the top surface 100a of the substrate 100 in a wire bonding manner, and the semiconductor chip 11 may be disposed on the top surface 100a of the substrate 100 in a flip chip bonding manner, but is not limited thereto. According to an embodiment of the invention, the semiconductor chips 10-12 may be in the form of a bare die or a chip package.

For example, a plurality of input/output pads (I/O pads) 101 may be disposed on the active surface of the semiconductor chip 10, and electrically connected to the corresponding bonding pads 202 (also known as "golden fingers") on the top surface 100a of the substrate 100 through the bonding wires 102. According to an embodiment of the invention, the bonding wires 102 may be gold wires or copper wires or the like, and the surface of each bonding pad 202 is usually provided with a solderable coating such as a nickel-gold layer or a copper-gold layer. For example, the semiconductor chip 12 can be electrically connected to the top surface 100a of the substrate 100 through the bonding wires 122.

According to an embodiment of the invention, a plurality of passive components 13 may be disposed on the top surface 100a of the substrate 100. For example, the passive components 13 may comprise a capacitor component, an inductor component, a resistor component, or the like, but is not limited thereto. According to an embodiment of the invention, the passive components 13 may be disposed on the top surface 100a of the substrate 100 using surface-mount technology (SMT), but is not limited thereto. According to an embodiment of the invention, the passive components 13 may be disposed on the top surface 100a of the substrate 100 between the semiconductor chips 10~12.

According to an embodiment of the present invention, for example, ground rings 211 and 212 are disposed on the top surface 100a of the substrate 100 around the semiconductor chips 11 and 12, respectively. The ground ring 211 surrounds the semiconductor chip 11 and the ground ring 212 surrounds the semiconductor chip 12. According to an embodiment of the invention, the ground rings 211 and 212 may have a continuous, annular pattern, but is not limited thereto. In some embodiments, the ground rings 211 and 212 may have a continuous, annular pattern, or the ground rings 211 and 212 may be composed of pad patterns arranged in a ring shape.

For example, the ground rings 211 and 212 may be formed of a patterned metal layer in the substrate 100 having a solderable plating layer, for example, a nickel-gold layer or a copper-gold layer, on the surface of the patterned metal layer. The ground rings 211 and 212 can be further electrically connected to aground layer (not shown) through the vias. According to an embodiment of the invention, the ground rings 211 and 212 may have a partially overlapping or shared portion, for example, an overlapping portion 213 between the semiconductor chips 11 and 12, but are not limited thereto. In some embodiments, the ground rings 211 and 212 may be annular patterns that are independent of one another.

According to an embodiment of the invention, a plurality of metal posts 311 are disposed on the ground ring 211, and a plurality of metal posts 312 are disposed on the ground ring 212. In accordance with an embodiment of the invention, the metal posts 311, 312 may comprise copper, silver, gold, aluminum, nickel, palladium, any combination or alloy thereof, or any suitable electrically conductive material. For example, the metal posts 311, 312 may be copper posts or copper-nickel alloy posts, but are not limited thereto. According to an embodiment of the invention, the metal posts 311 are arranged at least in one row, and the metal posts 312 are arranged at least in one row, but are not limited thereto. According to an embodiment of the present invention, at the overlapping portion 213 between the semiconductor chips 11 and 12, the metal posts 311 and the metal posts 312 are arranged in a staggered manner, as shown in the enlarged side view on the right side of FIG. 1, in order to achieve better electromagnetic interference shielding effect.

According to an embodiment of the invention, the metal posts 311, 312 may be formed by wire bonding, wherein one end of each of the metal posts 311, 312 is fixed on the ground rings 211, 212, and the other end is suspended (free end), as shown in FIG. 1. The metal posts 311, 312 are oriented straight up, surrounding the semiconductor chips 11 and 12, respectively, like a fence. According to an embodiment of the invention, the metal posts 311, 312 have an approximately the same height h, wherein the height h is higher than the target thickness of the subsequently formed molding compound (after grinding). Although FIG. 1 illustrates metal posts 311, 312 completely surrounding semiconductor chips 11 and 12, respectively, it will be understood by those skilled in the art that metal posts 311, 312 may surround only portions of semiconductor chips 11 and 12, respectively. For example, the metal posts may be disposed along only two sides or three sides of each of the semiconductor chips 11 and 12, rather than completely surrounding. For example, in another embodiment, the metal posts 311, 312 are disposed only at the overlapping portion 213 between the semiconductor chips 11 and 12.

Figure 6:
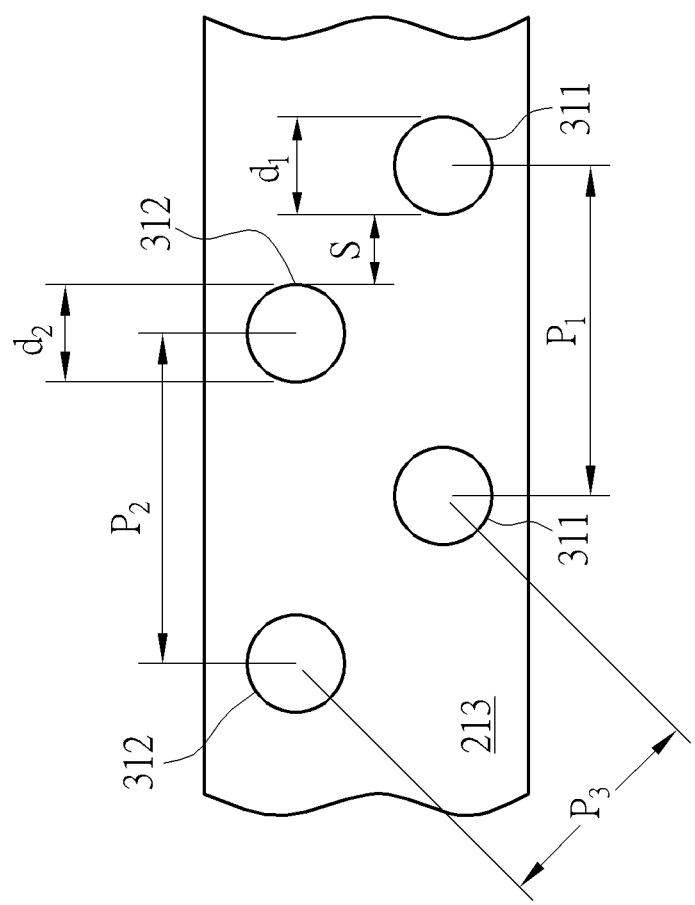
FIG. 6 and FIG. 7 are partial top views showing the arrangement of metal posts disposed at an overlapping region between semiconductor chips.
Figure 7:
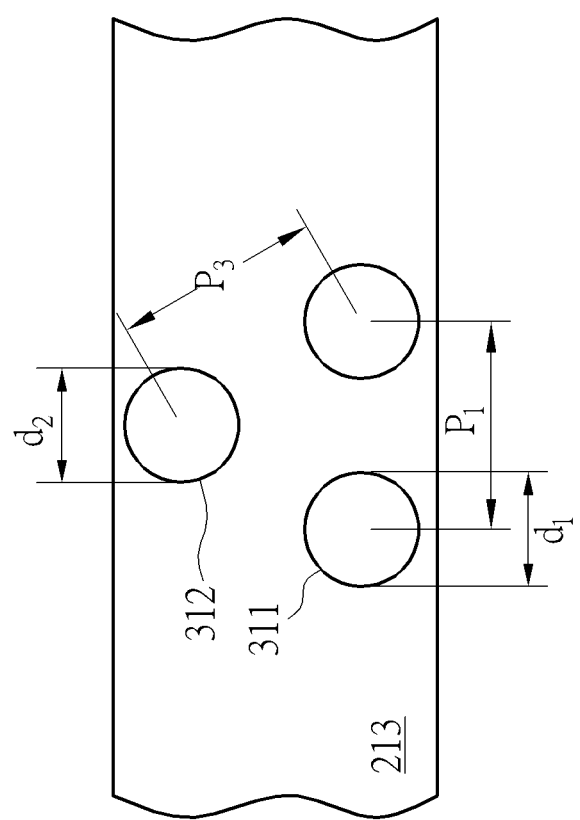

Referring to FIG. 6 and FIG. 7, which are partial top views showing the metal posts 311, 312 disposed at the overlapping portion 213 between the semiconductor chips 11 and 12. As shown in FIG. 6, the wire diameter $d_1$ of the metal post 311 may be equal or unequal to the wire diameter $d_2$ of the metal post 312. The pitch $P_1$ between the metal posts 311, the pitch $P_2$ between the metal posts 312, and the pitch $P_3$ between the metal posts 311, 312 may be equal or unequal to one another. The lateral distance S between the metal posts 311, 312 may be greater than or equal to zero. According to an embodiment of the present invention, for example, the lateral distance S between the metal posts 311, 312 may be in a range from about one tenth to about one percent of the wavelength of the electromagnetic wave to be shielded, but is not limited thereto. The value of the lateral distance S of the metal posts 311, 312 can be selected to provide EMI shielding for a particular frequency or range of frequencies.

For example, as shown in FIG. 7, the wire diameter $d_1$ of the metal post 311 may be equal to the wire diameter $d_2$ of the metal post 312, for example, greater than or equal to 15 micrometers, and the pitch $P_1$ between the metal posts 311 may be equal to the pitches $P_3$ between metal posts 311, 312, for example, approximately equal to 30 microns. It is to be understood that the above parameters including the wire diameter $d_1$ of the metal post 311, the wire diameter $d_2$ of the metal post 312, the pitch $P_1$ between the metal posts 311, the pitch $P_2$ between the metal posts 312, and the pitch P3 between the metal posts 311 and 312 can be adjusted according to the various design requirements.

In accordance with an embodiment of the invention, the stitching of the metal posts 311, 312 and the wire bonding steps of the semiconductor chips 10 and 12 may be performed simultaneously and may be completed in the same wire bonder. In addition, according to an embodiment of the present invention, the wire diameters of the metal posts 311, 312 may be the same as or different from the wire diameters of the bonding wires 102 and the bonding wires 122 on the semiconductor chips 10 and 12. For example, the wire diameters of the metal posts 311, 312 can be greater than the wire diameters of the bonding wires 102 and the bonding wires 122 on the semiconductor chips 10 and 12. In addition, the material of the metal posts 311 and 312 may be the same as or different from the material of the bonding wires 102 and the bonding wires 122 on the semiconductor chips 10 and 12.

Figure 2:
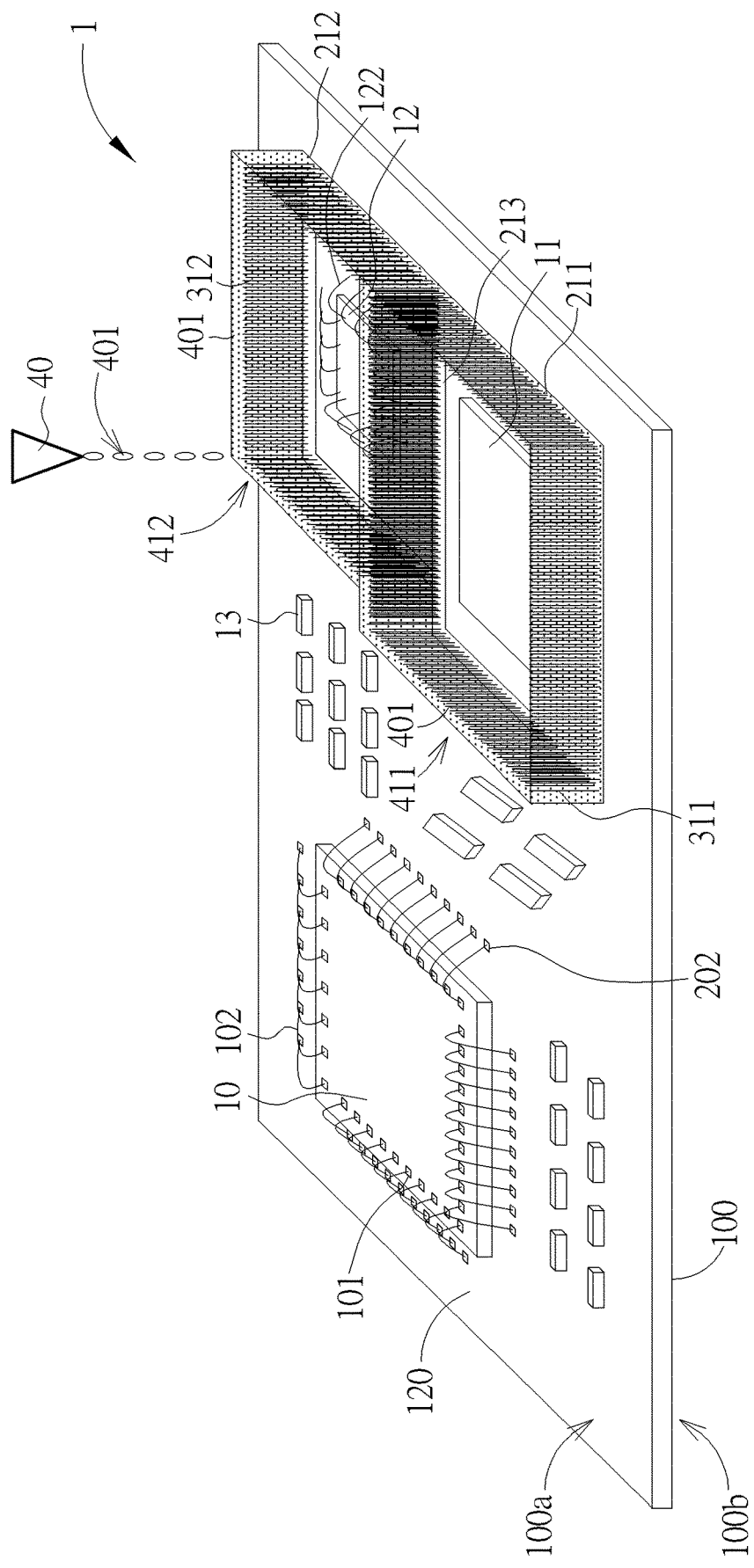

As shown in FIG. 2, after the formation of the metal posts 311, 312 is completed, a glue spraying process is subsequently performed, and glue 401 is sprayed on the metal posts 311, 312 along the ground rings 211 and 212 by a nozzle 40. The glue 401 is attached to the surface of the metal posts 311, 312 and filled into the gap between the metal posts 311, 312. According to an embodiment of the present invention, the glue 401 may be a thermosetting resin, a thermoplastic resin, an ultraviolet (UV) curing resin, or the like, but is not limited thereto. According to an embodiment of the invention, the glue 401 may be a conductive paste, such as silver or aluminum glue. According to an embodiment of the invention, the glue 401 may comprise conductive particles such as copper, silver, gold, aluminum, nickel, palladium, any combination or alloy thereof, graphene, or any suitable electrically conductive material. According to an embodiment of the invention, the glue 401 may further comprise a filler, such as quartz particles, diamond particles, or the like. According to an embodiment of the present invention, the glue 401 may further comprise a solvent or an additive (for example, a crosslinking agent, a catalyst or a modifier), and the like.

Subsequently, a curing process, such as heating or UV irradiation, may be performed such that the glue 401 adhered to the surface of the metal posts 311, 312 is cured or semi-cured. The glue 401 can strengthen the metal posts 311 and 312 so that the metal posts 311, 312 will not collapse during the fabrication process, and can also improve the shielding effect of electromagnetic interference and heat dissipation performance. After the curing process is completed, metal-post reinforced glue walls 411 and 412 are formed on the top surface 100a of the substrate 100. The metal-post reinforced glue wall 411 includes metal posts 311 surrounding the semiconductor chip 11 and the cured or semi-cured glue 401. The metal-post reinforced glue wall 412 includes metal posts 312 surrounding the semiconductor chip 12 and the cured or semi-cured glue 401.

According to some embodiments of the present invention, if the wire diameter $d_1$ of the metal post 311 and the wire diameter $d_2$ of the metal post 312 are larger, for example, greater than or equal to 25 micrometers, or greater than or equal to 35 micrometers, the glue spraying process may be omitted. Further, in some embodiments, it is understood that the steps of mounting the semiconductor chips on the top surface of the substrate, including but not limited to, chip bonding, wire bonding, flip chip bonding or the like, as shown in FIG. 1 may be performed after the metal posts are disposed on the ground ring as shown in FIG. 2.

Figure 3:
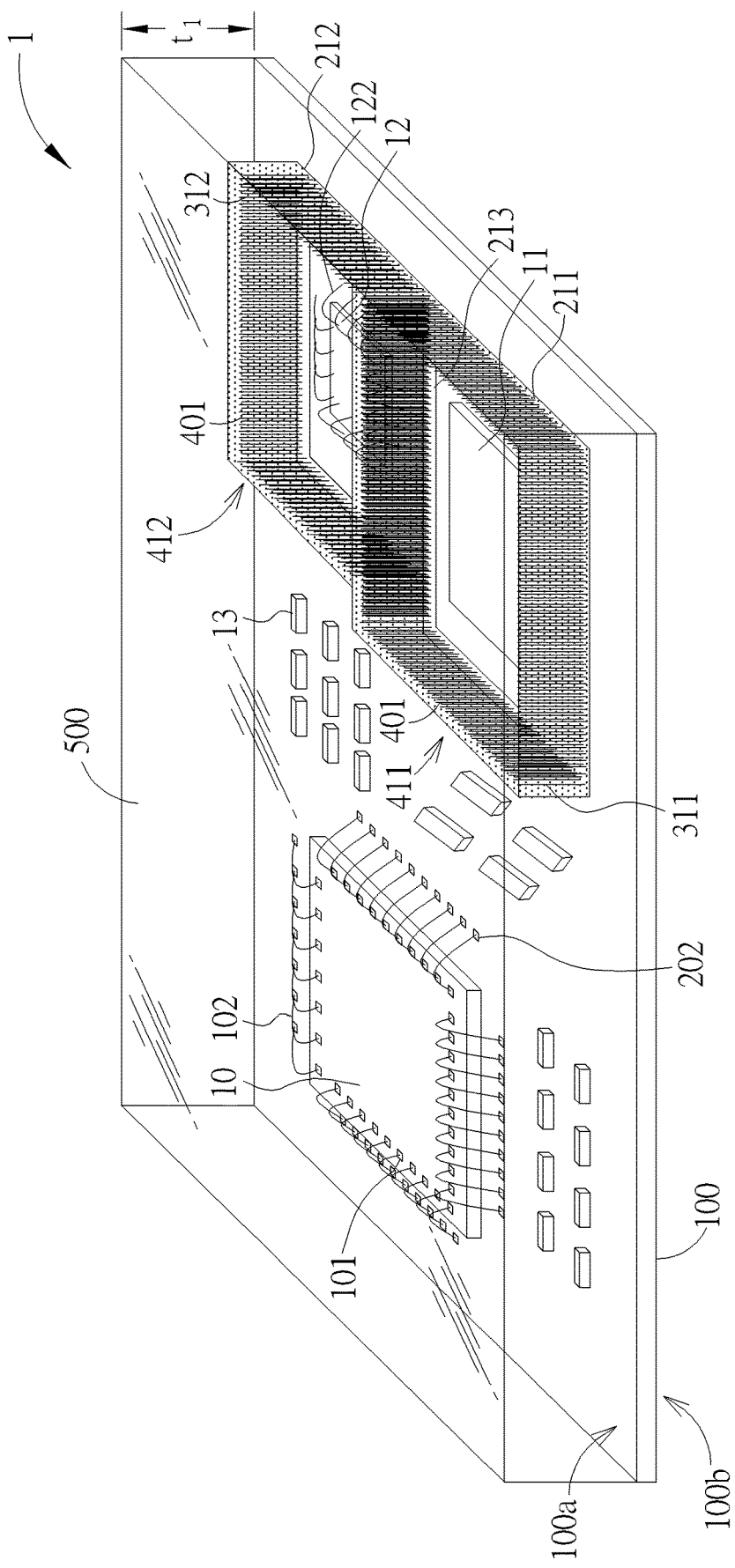

As shown in FIG. 3, a molding process is then performed to form a molding compound 500 on the top surface 100a of the substrate 100. According to an embodiment of the present invention, the molding compound 500 may comprise a resin material such as a thermosetting resin, a thermoplastic resin, a UV curing resin, or the like, but is not limited thereto. According to an embodiment of the present invention, the composition of the molding compound 500 is different from the composition of the glue 401. For example, the composition of the glue 401 may contain conductive particles, and the composition of the molding compound 500 basically does not contain conductive particles. However, the present invention is not limited thereto, and in some embodiments, the composition of the molding compound 500 may be the same as that of the glue 401, or the physical properties such as the thermal expansion coefficient, the stress, or the elastic modulus of the molding compound 500 and the glue 401 can be mutually match.

According to an embodiment of the invention, the molding compound 500 overflows the metal-post reinforced glue walls 411 and 412 and covers the regions other than the metal-post reinforced glue walls 411 and 412, including the semiconductor chip 10, the bonding wires 102, 122, and the passive components 13, which are encapsulated by the molding compound 500. According to an embodiment of the present invention, the molding compound 500 may be formed by various suitable methods, for example, compression molding, but is not limited thereto. According to an embodiment of the invention, the molding process may further comprise a curing process, such as a thermal curing process. At this point, as shown in FIG. 3, the molding compound 500 may have a first thickness $t_1$ after being thermally cured, wherein the first thickness $t_1$ is greater than the height h of the metal posts 311, 312 and the height of the metal-post reinforced glue walls 411 and 412.

Figure 4:
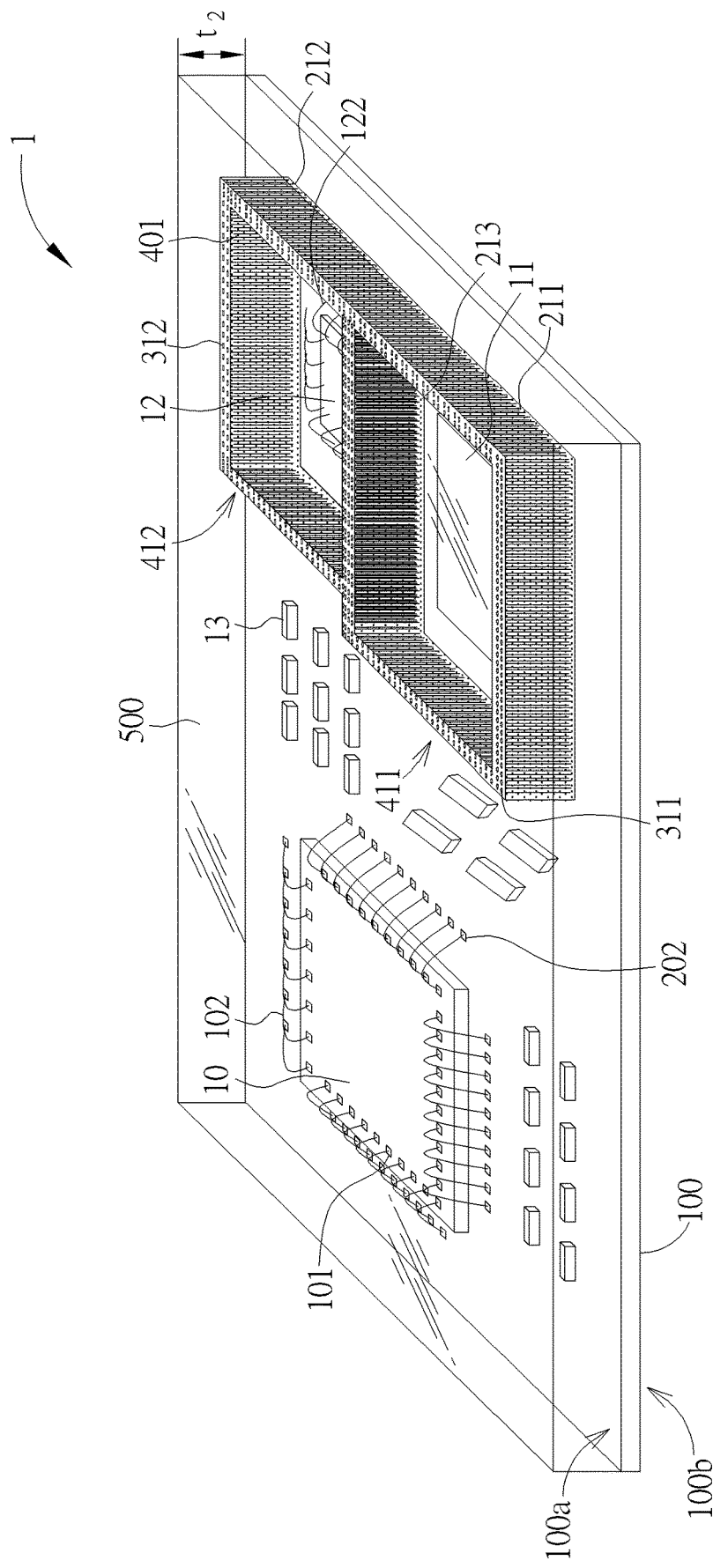

As shown in FIG. 4, after the molding process is completed, a polishing process may be performed to reduce the thickness of the molding compound 500 from the first thickness $t_1$ to a second thickness $t_2$, so that the top surfaces of the metal-post reinforced glue walls 411 and 412 are exposed, and the upper end faces of the metal posts 311, 312 are also exposed. At this point, the upper surface of the molding compound 500 is approximately flush with the top surfaces of the metal-post reinforced glue walls 411 and 412.

Figure 5:
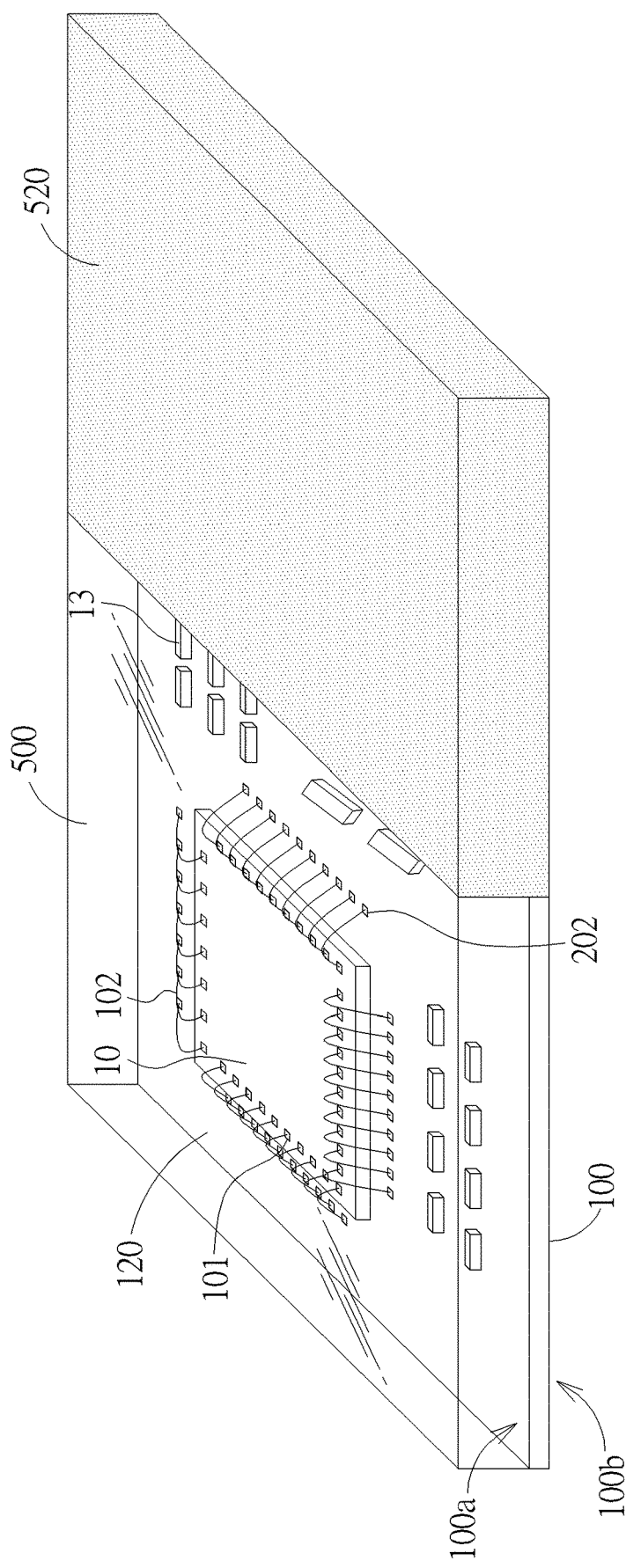

Finally, as shown in FIG. 5, a conductive layer 520 is formed on a predetermined region on the molding compound 500. In accordance with an embodiment of the invention, conductive layer 520 may be located directly over semiconductor chips 11 and 12 and metal-post reinforced glue walls 411 and 412. The conductive layer 520 may comprise a conductive coating, such as a conductive ink, which can include copper, silver, or other conductive metals. In another embodiment, the conductive layer 520 can comprise a layer of copper, aluminum, or other suitable metals. The conductive layer 520 directly contacts the exposed upper end faces of the metal posts 311, 312 and forms a grounded configuration through the metal posts 311, 312.

It is to be understood that the coverage and pattern of the conductive layer 520 in FIG. 5 are merely illustrative, and the present invention should not be limited thereto. In some embodiments, the entire surface on the molding compound 500, including the upper surface and the side surfaces, may be covered by the conductive layer 520. In some embodiments, the conductive layer 520 may cover only the semiconductor chip 11 or 12. At this point, the conductive layer 520 is in contact with the first metal-post reinforced glue wall 411 or 412 and a portion of the upper surface of the molding compound 500.

Structurally, as shown in FIG. 4 and FIG. 5, an embodiment of the present invention discloses a semiconductor package 1 having an in-package compartmental shielding, comprising: a substrate 100 having at least one high-frequency chip, for example, the semiconductor chip 11, disposed on a top surface 100a of the substrate 100, and a circuit component susceptible to high-frequency signal interference, such as the semiconductor chip 12. A ground ring 211 surrounds the high-frequency chip, such as the semiconductor chip 11, on the top surface 100a of the substrate 100. A metal-post reinforced glue wall 411 is disposed on the ground ring 211 surrounding the high-frequency chip. A ground ring 212 surrounds the circuit component on the top surface 100a of the substrate 100. A metal-post reinforced glue wall 412 is disposed on the ground ring 212 surrounding the circuit components. A molding compound 500 covers at least the high-frequency chip and the circuit component. A conductive layer 520 is disposed on the molding compound 500 and is in contact with the metal-post reinforced glue wall 411 and/or the metal-post reinforced glue wall 412.

According to an embodiment of the invention, the metal-post reinforced glue wall 411 includes a plurality of metal posts 311, wherein one end of each of the plurality of metal posts 311 is fixed on the ground ring 211, and the other end is suspended, wherein the plurality of metal posts 311 surround the high-frequency chip (e.g., the semiconductor chip 11).

According to an embodiment of the invention, the metal-post reinforced glue wall 412 includes a plurality of metal posts 312, wherein one end of each of the plurality of metal posts 312 is fixed on the ground ring 212, and the other end is suspended, wherein the plurality of metal posts 312 surround the circuit component (e.g., the semiconductor chip 12).

According to an embodiment of the invention, the metal-post reinforced glue wall 411 or the metal-post reinforced glue wall 412 further comprises a glue 401 attached to the surface of the metal posts 311 or the metal posts 312. According to an embodiment of the invention, the composition of the molding compound 500 is different from the composition of the glue 401.

Figure 8:
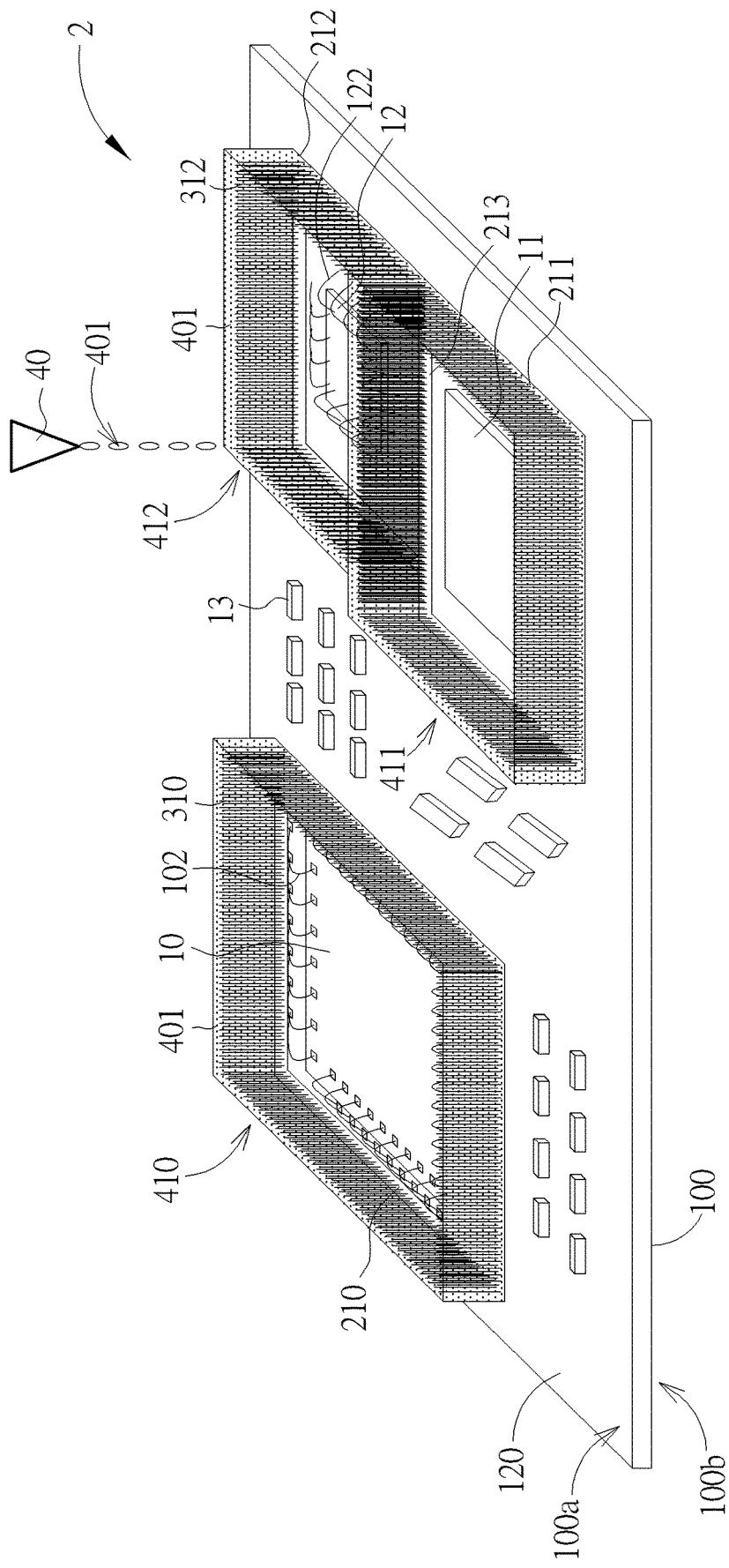
FIG. 8 and FIG. 9 are schematic diagrams showing a method of fabricating a semiconductor package having an in-package compartmental shielding according to another embodiment of the invention.
Figure 9:
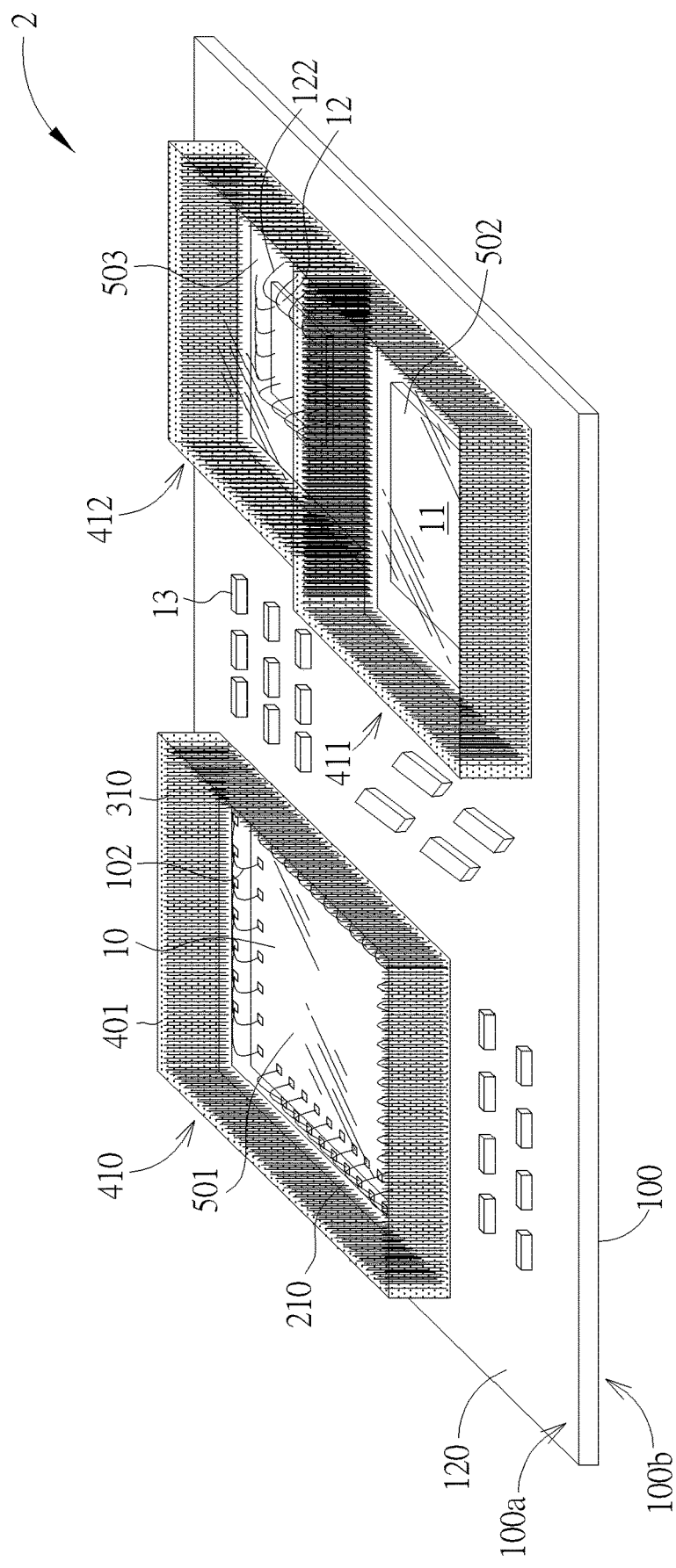

Please refer to FIG. 8 and FIG. 9, which are schematic diagrams showing a method for fabricating a semiconductor package with an in-package compartmental shielding according to another embodiment of the present invention, wherein like numeral numbers designate like layers, components or materials. As shown in FIG. 8, likewise, the semiconductor package 2 may be provided with a plurality of semiconductor chips 10-12 adjacent to each other on the top surface 100a of the substrate 100. For example, the semiconductor chip 10 may be a power management chip (PMIC), the semiconductor chip 11 may be a radio frequency chip (RFIC), and the semiconductor chip 12 may be a power amplifier chip (PAIC), but is not limited thereto. In accordance with an embodiment of the present invention, at least one high-frequency chip, such as the semiconductor chip 11, and a circuit component or chip susceptible to high-frequency signal interference, such as the semiconductor chip 12, are disposed on top surface 100a of substrate 100.

According to an embodiment of the present invention, for example, the semiconductor chips 10 and 12 may be disposed on the top surface 100a of the substrate 100 in a wire bonding manner, and the semiconductor chip 11 may be disposed on the top surface 100a of the substrate 100 in a flip chip bonding manner, but not limited thereto. According to an embodiment of the invention, the semiconductor chips 10-12 may be in a form of a bare chip or a chip package.

According to an embodiment of the invention, a plurality of passive components 13 may be disposed on the top surface 100a of the substrate 100. For example, the passive component 13 may be a capacitor component, an inductor component, a resistor component, or the like, but is not limited thereto. According to an embodiment of the present invention, the passive component 13 may be disposed on the top surface 100a of the substrate 100 using surface-mount technology (SMT), but is not limited thereto. According to an embodiment of the invention, the passive component 13 may be disposed on the top surface 100a of the substrate 100 between the semiconductor chips 10~12.

According to an embodiment of the present invention, for example, ground rings 210, 211, and 212 are respectively disposed on the top surface 100a of the substrate 100 around the semiconductor chips 10 to 12, wherein the ground ring 210 surrounds the semiconductor chip 10, the ground ring 211 surrounds the semiconductor chip 11, and the ground ring 212 surrounds the semiconductor chip 12. According to an embodiment of the invention, the ground rings 210~212 may be continuous, annular patterns, but are not limited thereto. In other embodiments, the ground rings 210-212 may be continuous, annular patterns, or may be composed of pad patterns arranged in a ring shape.

According to an embodiment of the invention, a plurality of metal posts 310 are disposed on the ground ring 210, a plurality of metal posts 311 are disposed on the ground ring 211, and a plurality of metal posts 312 are disposed on the ground ring 212. In accordance with an embodiment of the invention, the metal posts 310~312 may comprise copper, silver, gold, aluminum, nickel, palladium, any combination or alloy thereof, or any suitable electrically conductive material. For example, the metal posts 310~312 may be copper posts or copper-nickel alloy posts, but are not limited thereto. According to an embodiment of the invention, the metal posts 310~312 are arranged in at least one row, but are not limited thereto.

According to an embodiment of the invention, the metal posts 310~312 may be formed by wire bonding, wherein one end of each of the metal posts 310~312 is respectively fixed on the ground rings 210~212, and the other end is suspended, as shown in FIG. 1. The metal posts 310~312 are oriented straight up, and surround the semiconductor chips 10~12 like a fence. FIG. 8 illustrates that the metal posts 310~312 completely surround the semiconductor chips 10~12, respectively.

Subsequently, a glue spraying process is performed, and glue 401 is sprayed on the metal posts 310~312 along the ground rings 210~212 by using a nozzle 40, wherein the glue 401 is attached to the surface of the metal posts 310~312 and the gap between the metal posts is filled with the glue 401. According to an embodiment of the present invention, the glue 401 may be a thermosetting resin, a thermoplastic resin, a UV curing resin, or the like, but is not limited thereto. According to an embodiment of the invention, the glue 401 may be a conductive paste, such as silver or aluminum glue. According to an embodiment of the invention, the glue 401 may comprise conductive particles such as copper, silver, gold, aluminum, nickel, palladium, any combination or alloy thereof, graphene, or any suitable electrically conductive material. According to an embodiment of the invention, the glue 401 may further comprise a filler, such as quartz particles, diamond particles, or the like. According to an embodiment of the present invention, the glue 401 may further comprise a solvent or an additive (for example, a crosslinking agent, a catalyst or a modifier), or the like.

Subsequently, a curing process, such as heating or UV irradiation, may be performed such that the glue 401 adhered to the surfaces of the metal posts 310-312 is cured or semi-cured. The glue 401 can strengthen the metal posts 310~312 so that they do not collapse during the fabrication process, and can also enhance the EMI shielding effect and heat dissipation performance. After the curing process is completed, metal-post reinforced glue walls 410~412 are formed on the top surface 100a of the substrate 100, wherein the metal-post reinforced glue wall 410 includes the metal posts 310 surrounding the semiconductor chip 10 and the cured or semi-cured glues. 401, the metal-post reinforced glue wall 411 includes the metal posts 311 surrounding the semiconductor chip 11 and the cured or semi-cured glue 401, and the metal-post reinforced glue wall 412 includes the metal post 312 surrounding the semiconductor chip 12 and the cured or semi-cured glue 401.

According to other embodiments of the present invention, if the wire diameters of the metal posts 310~312 are relatively large, for example, greater than or equal to 25 micrometers, or greater than or equal to 35 micrometers, the glue spraying process may be omitted. Alternatively, the glue 401 is sprayed only onto a portion of the metal posts 310~312.

As shown in FIG. 9, a molding process is then performed to form molding compounds 501~503 within the metal post-reinforced glue walls 410~412, respectively, on the top surface 100a of the substrate 100. According to an embodiment of the present invention, the molding compounds 501~503 may comprise a resin material such as a thermosetting resin, a thermoplastic resin, a UV curing resin, or the like, but are not limited thereto. According to an embodiment of the present invention, the composition of the molding compounds 501~503 is different from the composition of the glue 401. For example, the composition of the glue 401 may include conductive particles, and the composition of the molding compounds 501~503 basically does not contain conductive materials. However, the present invention is not limited thereto, and in other embodiments, the composition of the molding compounds 501~503 may be the same as that of the glue 401, or the physical properties such as thermal expansion coefficient, stress or elastic modulus of the molding compounds 501~503 and the glue 401 can be mutually match.

According to an embodiment of the present invention, the molding compounds 501~503 do not overflow the metal-post reinforced glue walls 410~412, and thus do not cover the regions outside the metal-post reinforced glue walls 410~412. In other words, the molding compound 501 covers the semiconductor chip 10 and the bonding wires 102, the molding compound 502 covers the semiconductor chip 11, and the molding compound 503 covers the semiconductor chip 12 and the bonding wires 122. The areas outside the metal-post reinforced glue walls 410~412, including the passive components 13, are not encapsulated by the molding compound 501~503, and may be revealed. According to an embodiment of the present invention, the molding compounds 501~503 may be formed by various suitable methods, for example, a compression molding or a dispensing process, but are not limited thereto. According to an embodiment of the invention, the molding process may further comprise a curing process, such as a thermal curing process. Since only a part of the important components are encapsulated and protected by the molding compounds 501~503, the influence of the stress of the molding compounds 501~503 on the substrate 100 can be reduced, thereby improving the warpage problem of the semiconductor package 2. Subsequently, the polishing process and the conductive layer coating process as shown in FIG. 4 and FIG. 5 can be performed, and will not be described in further detail.

Figure 10:
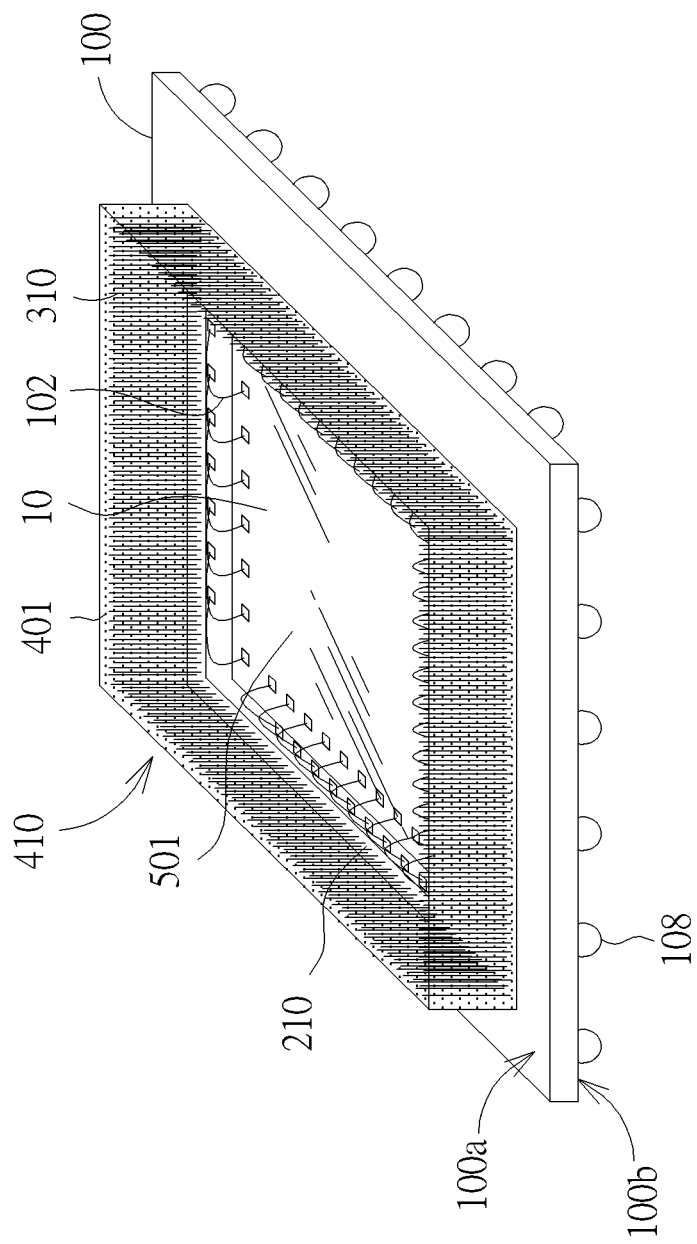
FIGS. 10 and 11 are schematic perspective views of a single-chip package according to other embodiments of the present invention.
Figure 11:
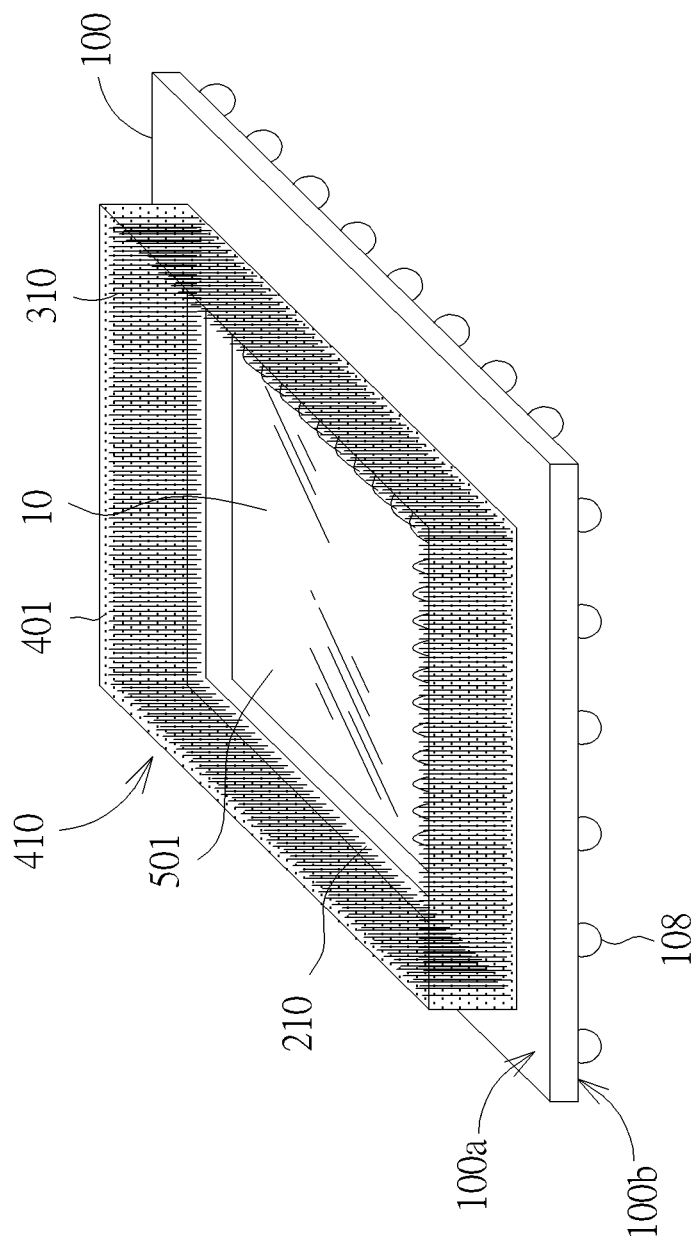

According to another embodiment of the present invention, the present disclosure further discloses a single chip package. As shown in FIG. 10 and FIG. 11, a single semiconductor chip 10, such as a processor or the like, is provided on the top surface 100a of the substrate 100. Connectors 108, such as ball grid array (BGA) solder balls, are provided on the bottom surface 100b of the substrate 100. The semiconductor chip 10 may be disposed on the top surface 100a of the substrate 100 by wire bonding (such as the bonding wires 102 shown in FIG. 10), or the semiconductor chip 10 can be disposed on the top surface 100a of the substrate 100 by flip chip bonding (as shown in FIG. 11). On the top surface 100a of the substrate 100, likewise, a ground ring 210 is provided to surround the semiconductor chip 10. A metal-post reinforced glue wall 410 is disposed on the ground ring 210 to surround the semiconductor chip 10. The metal-post reinforced glue wall 410 comprises a plurality of metal posts 310, wherein one end of each of the plurality of metal post 310 is fixed on the ground ring 210, the other end is suspended, and the plurality of metal posts 310 surround the semiconductor chip 10. The metal-post reinforced glue wall 410 further comprises a glue 401 attached to the surface of the metal posts 310. A molding compound 501 is disposed within the metal-post reinforced glue wall 410. According to an embodiment of the present invention, the composition of the molding compound 501 is different from the composition of the glue 401. For example, the composition of the glue 401 may include conductive particles such as copper, silver, gold, aluminum, nickel, palladium, any combination or alloy thereof, or graphene. The composition of the molding compound 501 basically does not contain conductive particles. However, the present invention is not limited thereto, and in other embodiments, the composition of the molding compound 501 may be the same as that of the glue 401, or the physical properties such as thermal expansion coefficient, stress, or elastic modulus of the molding compound 501 and the glue 401 can be mutually match. The molding compound 501 does not overflow the metal-post reinforced glue wall 410, and thus does not cover the region outside the metal-post reinforced glue wall 410. The molding compound 501 can be formed by various suitable methods, for example, a compression molding or a dispensing process, but is not limited thereto. Since only the semiconductor chip 10 is encapsulated and protected by the molding compound 501, the influence of the stress of the molding compound 501 on the substrate 100 can be reduced, thereby improving the warpage problem. Subsequently, the polishing process and the conductive layer coating process as shown in FIG. 4 and FIG. 5 can be performed, and will not be described in further detail.

Compared with the prior art, the present invention has at least the following advantages: (1) the disclosed method is compatible with existing fabrication processes, and the process steps are simplified, so the cost is relatively low; (2) the size of the disclosed semiconductor package or module can be minimized; (3) the arrangement of the metal-post reinforced glue walls or compartmental shielding structures on the substrate has high flexibility; (4) the disclosed method is capable of achieving high UPH (unit per hour) mass production; and (5) by adjusting the number of rows (tiers) and metal post diameters and/or spacing, etc., the present disclosure can be flexibly applied to various frequency ranges in which electromagnetic radiation is to be shielded.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package with an in-package compartmental shielding, comprising:
    a substrate having at least one high-frequency chip and a circuit component susceptible to high-frequency signal interference on a top surface of the substrate;
    a first ground ring, on the top surface of the substrate, surrounding the high-frequency chip;
    a first metal-post reinforced glue wall disposed on the first ground ring, surrounding the high-frequency chip, wherein the first metal-post reinforced glue wall comprises a plurality of first metal posts, wherein one end of each of the plurality of first metal posts is fixed on the first ground ring, and the other end is suspended, and the plurality of first metal posts surrounds the high-frequency chip;
    a second ground ring surrounding the circuit component on the top surface of the substrate;
    a second metal-post reinforced glue wall disposed on the second ground ring surrounding the circuit component, wherein the second metal-post reinforced glue wall comprises a plurality of second metal posts, wherein one end of each of the plurality of second metal posts is fixed on the second ground ring, and the other end is suspended, and the plurality of second metal posts surrounds the circuit component;
    a molding compound disposed only inside the first metal-post reinforced glue wall and the second metal-post reinforced glue wall and covering at least the high-frequency chip and the circuit component, respectively; and
    a conductive layer disposed on the molding compound and in contact with the first metal-post reinforced glue wall and/or the second metal-post reinforced glue wall.

2. The semiconductor package with an in-package compartmental shielding according to claim 1, wherein the first metal-post reinforced glue wall or the second metal-post reinforced glue wall further comprises a glue attached to a surface of each of the plurality of the first or second metal posts.

3. The semiconductor package with an in-package compartmental shielding according to claim 2, wherein the glue comprises a thermosetting resin, a thermoplastic resin or an ultraviolet (UV) curing resin.

4. The semiconductor package with an in-package compartmental shielding according to claim 2, wherein the glue comprises a conductive paste.

5. The semiconductor package with an in-package compartmental shielding according to claim 2, wherein the glue comprises conductive particles.

6. The semiconductor package with an in-package compartmental shielding according to claim 5, wherein the conductive particles comprise copper, silver, gold, aluminum, nickel, palladium, any combination or alloy thereof, or graphene.

7. The semiconductor package with an in-package compartmental shielding according to claim 5, wherein a composition of the molding compound is different from a composition of the glue.

8. The semiconductor package with an in-package compartmental shielding according to claim 1, wherein a top surface of the molding compound is flush with a top surface of the first metal-post reinforced glue wall and a top surface of the second metal-post reinforced glue wall.

9. A semiconductor package, comprising:
a substrate having at least one semiconductor chip disposed directly on a top surface of the substrate;
a ground ring surrounding the semiconductor chip on the top surface of the substrate;
a metal-post reinforced glue wall disposed on the ground ring to surround the semiconductor chip; and
a molding compound disposed only inside the metal-post reinforced glue wall and covering the semiconductor chip.

10. The semiconductor package according to claim 9, wherein the metal-post reinforced glue wall comprises a plurality of metal posts, wherein one end of each of the plurality of metal posts is fixed on the ground ring, and the other end is suspended, and the plurality of metal posts surrounds the semiconductor chip.

11. The semiconductor package according to claim 10, wherein the metal-post reinforced glue wall further comprises a glue attached to a surface of each of the plurality of the metal posts.

12. The semiconductor package according to claim 11, wherein the glue comprises a thermosetting resin, a thermoplastic resin or an ultraviolet (UV) curing resin.

13. The semiconductor package according to claim 11, wherein the glue comprises a conductive paste.

14. The semiconductor package according to claim 13, wherein the glue comprises conductive particles.

15. The semiconductor package according to claim 14, wherein the conductive particles comprise copper, silver, gold, aluminum, nickel, palladium, any combination or alloy thereof, or graphene.

16. The semiconductor package according to claim 11, wherein a composition of the molding compound is different from a composition of the glue.

17. The semiconductor package according to claim 9, wherein a top surface of the molding compound is flush with a top surface of the metal-post reinforced glue wall.

* * * * *